United States Patent
Bagepalli et al.

(10) Patent No.: US 6,535,775 B1
(45) Date of Patent: Mar. 18, 2003

(54) PROCESSOR SYSTEM AND METHOD FOR INTEGRATING COMPUTERIZED QUALITY DESIGN TOOLS

(75) Inventors: Bharat Sampathkumaran Bagepalli, Niskayuna, NY (US); Aniruddha Dattatraya Gadre, Niskayuna, NY (US); Mohamed Ahmed Ali, Niskayuna, NY (US); Michael Joseph Krok, Clifton Park, NY (US); Bijan Dorri, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 253 days.

(21) Appl. No.: 09/653,856

(22) Filed: Sep. 1, 2000

(51) Int. Cl.$^7$ .............................................. G06F 19/00
(52) U.S. Cl. ...................................... 700/109; 700/174
(58) Field of Search ........................... 700/109, 97, 95, 700/108, 174, 204, 160; 705/7–10

(56) References Cited

U.S. PATENT DOCUMENTS

| | | | |
|---|---|---|---|
| 5,278,751 A | * | 1/1994 | Adiano et al. ................. 705/10 |
| 5,732,200 A | * | 3/1998 | Becker et al. .............. 358/1.15 |
| 5,765,038 A | * | 6/1998 | Flannery et al. ............... 707/10 |
| 6,301,516 B1 | * | 10/2001 | Ostrowski et al. .......... 700/109 |
| 6,351,680 B1 | * | 2/2002 | Ali et al. ..................... 700/109 |

OTHER PUBLICATIONS

J. Hauser, et al, "The House of Quality", Harvard Business Review, May–Jun. 1988, vol. 66, No. 3, pp. 63–73.
U.S. patent application entitled "Method for Identifying Critical to Quality Dependencies" by M. Ostrowski, et al, Ser. No. 09/275,985 filed Mar. 25, 1999.
U.S. patent application entitled "Method for Quality Function Deployment" by M. Ali, et al, Ser. No. 09/312,690 filed May 14, 1999.

* cited by examiner

Primary Examiner—Leo Picard
Assistant Examiner—Kidest Bahta

(57) ABSTRACT

A processor system and method for integrating a quality function deployment tool with a critical to quality tool is provided. Each of the tools is a computer-enabled tool. The method allows for executing quality function deployment at each of a plurality of levels with the quality function deployment tool for a system designable from a respective family of subsystem alternatives. The method further allows for generating quality matrices indicating a relationship between an original set of critical to quality characteristics and key control parameters with the critical to quality tool for the respective family of subsystem alternatives. A linking action allows for linking the quality function deployment tool to the critical to quality tool for tracking at each level the extent to which the original set of critical to quality characteristics is met by each respective family of subsystem alternatives.

25 Claims, 15 Drawing Sheets

| CUSTOMER EXPECTATION | IMPORTANCE | LAMP BRIGHTNESS | LAMP FOCAL SPOT | LAMP LIFE | COOLING SYSTEM NOISE | LENS CLARITY | LENS COST | LAMP COST |
|---|---|---|---|---|---|---|---|---|
| IMAGE QUALITY | 1 | h | h | | | h | | |
| PROJECTOR NOISE | 1 | m | | | h | | | |
| PROJECTOR LIFE | 1 | | | h | | | | |
| PROJECTOR COST | 1 | | | | | | h | h |

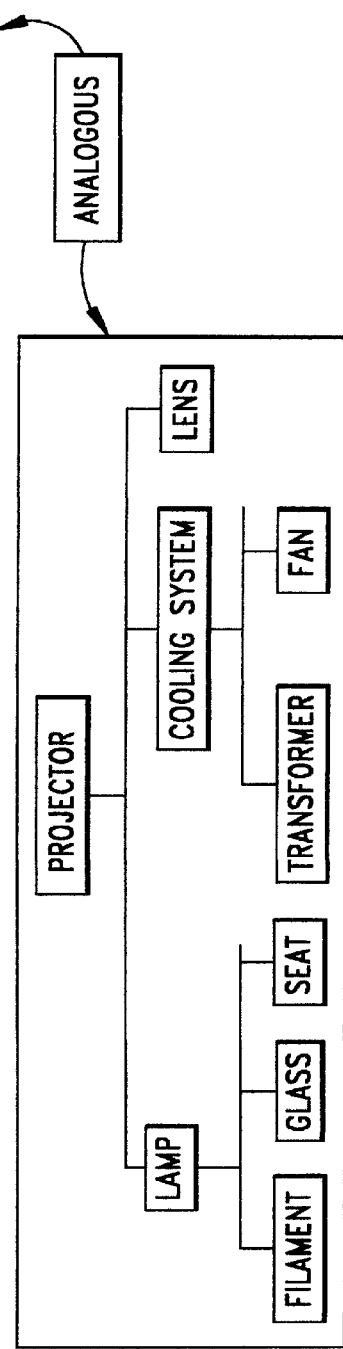

| PROJECT TITLE: PROJECTOR GENERAL | | | | | |
|---|---|---|---|---|---|
| SYSTEM | PROJECTOR | SUBSYSTEM 1 | LAMP | COMPONENT 1 | FILAMENT |
| CTQ'S | IMAGE QUALITY | CTQ'S | BRIGHTNESS | CTQ'S | FILAMENT CENTERING |
|  | PROJECTOR NOISE |  | FOCAL SPOT |  | FILAMENT DIAMETER |
|  | PROJECTOR LIFE |  | LIFE | COMPONENT 2 | GLASS |
|  | PROJECTOR COST |  | COST | CTQ'S | GLASS DURABILITY |
|  |  |  |  |  | GLASS CLARITY |
|  |  |  |  | COMPONENT 2 | SEAT |
|  | ALLOWS ANY NUMBER OF LEVELS → | SUBSYSTEM 2 | COOLING SYSTEM | CTQ'S | CONDUCTIVITY |
|  |  | CTQ'S | NOISE |  |  |
|  |  |  | AIR SPEED |  |  |
|  |  | SUBSYSTEM 3 | LENS |  | ALLOWS ANY NUMBER OF CTQ'S |
|  |  | CTQ'S | CLARITY |  |  |
|  |  |  | COST |  |  |
| GENERATE ALL QFD'S | | | | | |

150

FIG. 8
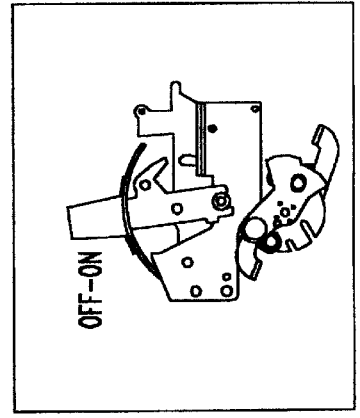
OFF-ON
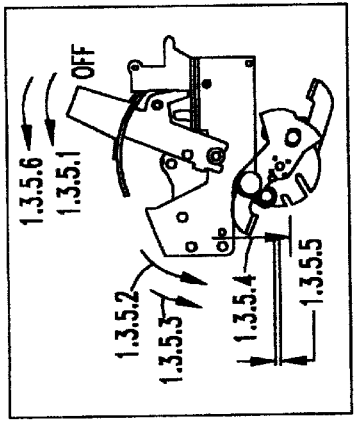
| | | MECHANISM | 5.1 CRADLE | 5.1.1 RADIUS, INCH | 5.1.2 DIAL L1, INCH | 5.2 OPENING LINKS | 5.3 CLOSING LINKS | 5.4 OPERATING SPRINGS | 5.4.1 STIFFNESS, LB/IN | 5.4.2 LO, INCH | 5.5 FRAMES | 5.6 X-BAR |
|---|---|---|---|---|---|---|---|---|---|---|---|---|
| 1.3.5 | OFF TO ON | | | | | | | | | | | |
| | 1.3.5.1 | HANDLE FORCE, POUNDS | | | | | | | | | | |
| | 1.3.5.2 | CONTACT GAP, INCH | | | | | | | | | | |
| | 1.3.5.3 | CONTACT CLOSING VEL. INCH/SEC | | | | | | | | | | |
| | 1.3.5.4 | CONTACT FORCE, POUNDS | | | | | | | | | | |
| | 1.3.5.5 | CONTACT DEFORMATION, INS. | | | | | | | | | | |
| | 1.3.5.6 | HANDLE MOTION, DEGREES | | | | | | | | | | |
| | DESIRED OUTPUTS | | | | | | | | | | | |

PRODUCT REQUIREMENT

| CUSTOMER EXPECTATION | IMPORTANCE | LAMP BRIGHTNESS | LAMP FOCAL SPOT | LAMP LIFE | COOLING SYSTEM NOISE | LENS CLARITY | LENS COST | LAMP COST |
|---|---|---|---|---|---|---|---|---|
| IMAGE QUALITY | 1 | h | h | | | h | | |
| PROJECTOR NOISE | 1 | m | | | h | | | |
| PROJECTOR LIFE | 1 | | | h | | | | |
| PROJECTOR COST | 1 | | | | | | h | h |

PROJECTOR NOISE = $3^X$ (LAMP BRIGHTNESS) + $9^X$ (COOLING SYSTEM NOISE)

IMAGE QUALITY = (LAMP BRIGHTNESS) + (LAMP FOCAL SPOT) + (LENS CLARITY)

PROJECTOR COST = LENS COST + LAMP COST

FIG. 9

MARKET DATA / PRODUCT REQUIREMENT

| CUSTOMER EXPECTATION | IMPORTANCE | X1 | X2 | X3 | X4 | X5 | X6 | X7 | X8 | TOTAL |
|---|---|---|---|---|---|---|---|---|---|---|
| Y1 | 5 | h | | | | l | l | l | | 60 |
| Y2 | 5 | | | | | | | h | h | 90 |
| Y3 | 4 | | | | | | | m | | 12 |
| Y4 | 3 | | | h | m | | | | l | 39 |
| Y5 | 2 | | l | | | | | | l | 4 |
| Y6 | 1 | l | | | | m | m | | | 7 |
| TOTAL | | 45 | 2 | 27 | 9 | 8 | 53 | 17 | 50 | |

MARKET DATA — 300

| CUSTOMER EXPECTATION | IMPORTANCE | X1 | X2 | X3 | X4 | X5 | X6 | X7 | X8 | TOTAL |
|---|---|---|---|---|---|---|---|---|---|---|
| Y1 | 5 | h | | | | l | l | l | | 60 |
| Y2 | 5 | | | | | | | m | h | 90 |
| Y3 | 4 | | | | | | | m | | 12 |
| Y4 | 3 | | | h | m | | | | l | 39 |
| Y5 | 2 | | l | | | | | | l | 4 |
| Y6 | 1 | l | | | | m | m | | | 7 |
| TOTAL | | 48 | 2 | 27 | 9 | 8 | 73 | 17 | 50 | |

312 = PRODUCT REQUIREMENT; 318 = TOTAL row

DESIGN — 400, DESIGN FEATURES

| PRODUCT REQUIREMENT | IMPORTANCE | X1 | X2 | X3 | X4 | X5 | X6 | X7 | X8 | X9 | TOTAL |
|---|---|---|---|---|---|---|---|---|---|---|---|
| X1 | 5 | l | | | | | | | | h | 50 |
| X2 | 1 | | l | | m | m | | h | | | 16 |
| X3 | 2 | | | | | | | h | l | | 30 |
| X4 | 1 | | | | | | m | | | | 3 |
| X5 | 1 | | l | | m | | | h | h | | 22 |
| X6 | 3 | | | | l | l | | | | | 10 |
| X7 | 2 | h | | | | | | l | | | 30 |
| X8 | 5 | | | | h | h | h | | m | | 50 |
| TOTAL | | 32 | 1 | 1 | 63 | 61 | 63 | 30 | 16 | 72 | |

414 = IMPORTANCE; 412 = DESIGN FEATURES; 416 = cells; 418 = TOTAL

MANUFACTURING — 500, MFG PROCESS

| DESIGN FEATURES | IMPORTANCE | MFG1 | MFG2 | MFG3 | MFG4 | MFG5 | MFG6 | MFG7 | MFG8 | TOTAL |
|---|---|---|---|---|---|---|---|---|---|---|
| d1 | 3 | | h | | | | | h | | 54 |
| d2 | 1 | | | | l | | | h | | 10 |
| d3 | 1 | | l | l | | | | h | | 2 |
| d4 | 6 | | | | | | m | | l | 20 |
| d5 | 6 | h | h | | | | l | | | 11 |
| d6 | 5 | | | m | | | l | | l | 26 |
| d7 | 3 | l | | | l | | l | | | 6 |
| d8 | 2 | | l | l | l | | | m | m | 16 |
| d9 | 5 | | | l | | l | | | | 6 |
| TOTAL | | 40 | 44 | 48 | 16 | 6 | 29 | 20 | 43 | |

512 = MFG PROCESS; 514 = IMPORTANCE; 516 = cells; 518 = TOTAL

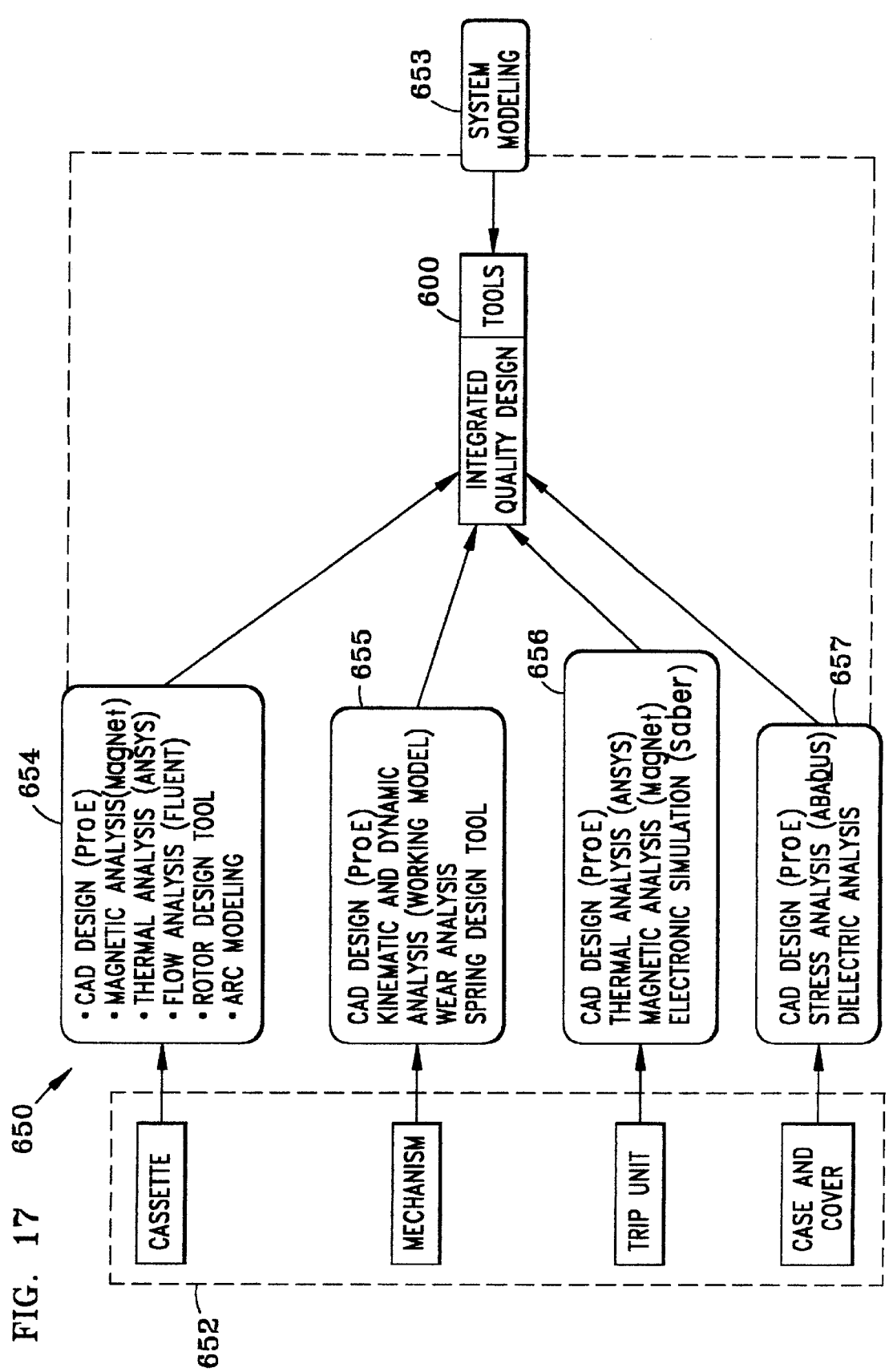

PROCESSOR SYSTEM AND METHOD FOR INTEGRATING COMPUTERIZED QUALITY DESIGN TOOLS

BACKGROUND OF THE INVENTION

The present invention relates to a quality design processing tool and techniques enabled by such tool and, more particularly, the present invention relates to a computerized tool and techniques that allow for integrating a quality function deployment (QFD) tool with a critical to quality (CTQ) tool.

A system can be represented as an assemblage of elements working in tandem and forming a unitary object that performs one or more tasks. Typically, components of a system cannot meet the objectives assigned to the whole system. Therefore, a system may be described by its elements, their merits, and the relationships that tie them together. In addition, a component of a system can itself be a system. For example, an engine is a component of another system, an airplane, which in turn can be a part of a bigger system, air transportation, and so on. A tree structure of system, subsystems, components, parts, etc. can be utilized to represent a system. FIG. 1 shows one typical prior art architecture representation of an exemplary projector system which includes sub-system and component levels.

The ability of the system to meet its assigned objective can be gauged using certain figures of merit or critical to quality (CTQ) parameters. Similarly, each element of the system has its own list of CTQ's upon which the performance of the element as part of the system can be gauged. The values of the CTQ's at a first level (e.g., the system level) may depend on the values of the CTQ's at subsequent levels (e.g. sub-system and component levels).

Techniques have been developed to define CTQ's at various system levels so that the overall system CTQ's can be met. Generally, a quality function deployment (QFD) tool allows for identifying CTQ's and flowing them down to subsequent levels. FIG. 2 is a block diagram of a known CTQ flow down process. The relationship between each level CTQ's and key control parameters (KCP's) has been referred to as a house of quality. FIG. 2 shows the flow of CTQ's from the customer requirements to functional requirements and then to part characteristics down to manufacturing processes CTQ's and to process variables. At each level, the CTQ's are identified and their relations to the higher level CTQ's are specified qualitatively by respective entries, such as high (designated h), medium (designated m), or low (designated l), depending on the relation strength. FIG. 3 is typical prior art house of quality or quality matrix relating customer expectations represented by CTQ's 2 to product requirements represented by key control parameters 4 (KCP's). FIG. 3 illustrates the qualitative effect that each KCP 4 has on one or more CTQ's 2.

When applied at the system level of the example in FIG. 1, QFD will yield a first house of quality for that system as shown in FIG. 3. In that house of quality, KCP's 4 corresponding to different sub-systems of the overall system (e.g. lamp, cooling, lens) are not arranged in any order. This generally results in a loss of the system architecture and renders analysis of sub-system and component requirements difficult. The problem is particularly evident when flowing down the CTQ's to components and parts of each subsystem. If the tree structure in FIG. 1 is deep or complex, the CTQ list will rapidly grow in size and the system structure will be difficult, if not impossible, to ascertain. Therefore, known QFD tools may be somewhat valuable for "shallow" systems (e.g., systems with a limited number of elements and levels) but have disadvantages when applied to "deep" systems having numerous levels and components. Moreover, prior to the present invention, there have been no direct links between the QFD tool and the CTQ tool. Thus, the extent to which the top customer needs are met may not be directly tracked. Further, there is no automated requirements' management tracking, and system design trade-off tool.

In view of the foregoing, it would be desirable to provide an improved quality design tool with direct links between the QFD tool and the CTQ tool, so that the extent to which the top customer needs are met may be quickly and reliably tracked down to the subsystem level. It would be further desirable to provide a tool capable of executing automated requirements' management tracking, and system design trade-off that would permit continuous evaluation of design alternatives. Additionally, it would be desirable to provide an improved quality tool that enables the evaluation of system and subsystem design capability to help identify potential new customers/markets and technologies.

It will be appreciated that many systems designed to meet specific top customer needs often satisfy a subset of requirements for a different product/customer. Also, systems meeting customer needs for a particular product often satisfy some additional ones ("Bonus Capability"). Such systems may require relatively minor modifications/additions to satisfy additional derivative market needs unrelated to the original. Thus, it would be desirable to provide an improved quality design tool that would allow for bypassing years of costly and lengthy development efforts when derivative products are designed from a base system to serve new markets.

BRIEF SUMMARY OF THE INVENTION

Generally speaking, one aspect of the present invention fulfills the foregoing needs by providing in one exemplary embodiment a method for integrating a quality function deployment tool with a critical to quality tool. Each of the tools comprises a computer-enabled tool. The method allows for executing quality function deployment at each of a plurality of levels with the quality function deployment tool for a system designable from a respective family of subsystem alternatives. The method further allows for generating quality matrices indicating a relationship between an original set of critical to quality characteristics and key control parameters with the critical to quality tool for the respective family of subsystem alternatives. A linking action allows for linking the quality function deployment tool to the critical to quality tool for tracking at each level the extent to which the original set of critical to quality characteristics is met by each respective family of subsystem alternatives.

The present invention may further fulfill the foregoing needs by providing in another aspect thereof a computer-readable medium encoded with computer program code for integrating a quality function deployment tool with a critical to quality tool. The program code causing a computer to execute a method comprising:

executing quality function deployment at each of a plurality of levels with the quality function deployment tool for a system designable from a respective family of subsystem alternatives for an original system design;

generating quality matrices indicating a relationship between an original set of critical to quality characteristics and key control parameters with the critical to quality tool for the respective family of subsystem alternatives, the original set of critical to quality parameters based on predefined data for the original system design;

linking the quality function deployment tool to the critical to quality tool for tracking at each level the extent to which the original set of critical to quality characteristics is met by each respective family of subsystem alternatives;

tracking at each level the extent to which each respective family of subsystem alternatives meets a modified set of critical to quality parameters based on new data for the original system design; and determining for each family of subsystem alternatives a derivative of one or more subsystem alternatives that meets the modified set of critical to quality parameters.

The present invention may still further fulfill the foregoing needs by providing in yet another aspect thereof a processor configured to integrate a quality function deployment tool with a critical to quality tool. The processor may comprise a processor module configured to execute quality function deployment at each of a plurality of levels for a system designable from a respective family of subsystem alternatives for an original system design. A generator module is configured to generate quality matrices indicating a relationship between an original set of critical to quality characteristics and key control parameters for the respective family of subsystem alternatives. The original set of critical to quality parameters may be based on predefined data for the original system design. A linking module is configured to link the quality function deployment tool to the critical to quality tool to track at each level the extent to which the original set of critical to quality characteristics is met by each respective family of subsystem alternatives. A tracking module is configured to track at each level the extent to which each respective family of subsystem alternatives meets a modified set of critical to quality parameters based on new data for the original system design. A processing module is configured to determine for each family of subsystem alternatives a derivative of one or more subsystem alternatives that meets the modified set of critical to quality parameters. A coupling module is configured to selectably couple respective modules representative of respective members of each family of subsystem alternatives to determine effects to the set of critical to quality parameters caused by the selectably coupled modules.

BRIEF DESCRIPTION OF THE DRAWINGS

Referring now to the drawings wherein like elements are numbered alike:

FIG. 3 is an exemplary house of quality resulting from applying the prior art techniques of FIG. 2 to the exemplary system of FIG. 1;

FIG. 6 depicts improved system representations in an exemplary embodiment of another aspect of the invention;

FIG. 8 depicts use of a computer-aided process such as may be used for developing a respective transfer function for another exemplary system;

FIG. 9 is a schematic for depicting generation of an exemplary quantitative relationship between CTQ's and KCP's;

FIG. 10 is a quality matrix such as may be generated by relating market data to product requirements;

FIG. 13 depicts a hierarchy of quality matrices;

FIG. 17 is a block diagram illustrating an exemplary integration of the tool of FIG. 15 in the context of an exemplary circuit breaker system.

DETAILED DESCRIPTION OF THE INVENTION

As suggested above, an exemplary embodiment of the invention may be directed to a QFD process which preserves system architecture and which is integrated with a CTQ process. The QFD process includes generating a plurality of quality matrices each focusing on a certain element of the system while maintaining their common systemic grounds which stem from sharing the same CTQ's at the higher level quality matrix. The term "quality matrix" refers to defining a relationship between CTQ's and KCP's and is not limited to a conventional matrix format (i.e., rows and columns).

Figure 4:
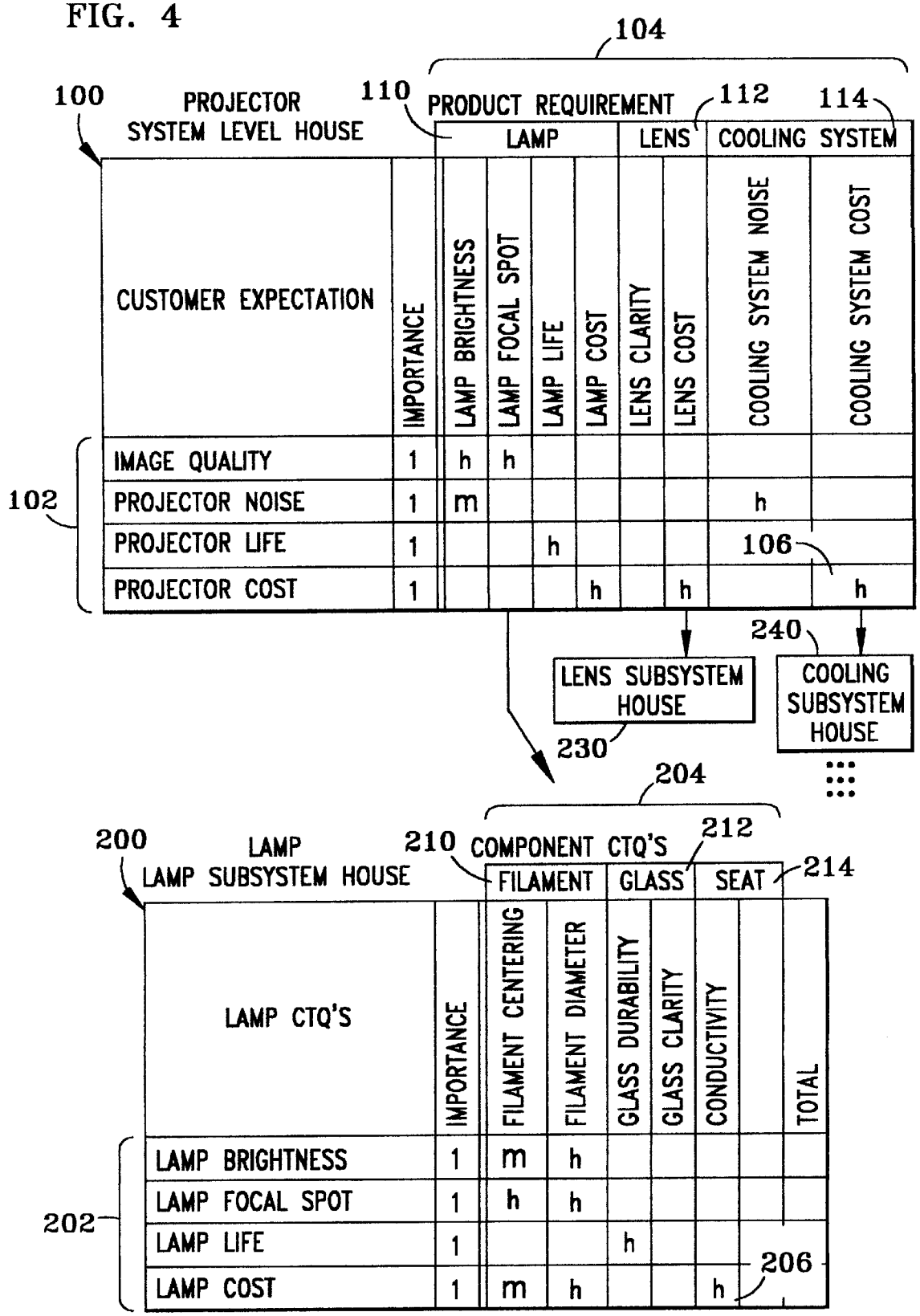
FIG. 4 is a diagrammatic representation of quality function deployment across multiple levels in an exemplary embodiment of one aspect of the invention.

FIG. 4 depicts an arrangement of quality matrices in an exemplary embodiment of the invention. Although the description that follows is primarily set forth in the context of an exemplary projector system, it will be appreciated that the present invention is not limited to any specific system being that any system made up of multiple subsystems and components will benefit from the teachings of the present invention. At a first level, a system quality matrix 100 relates CTQ's 102 to KCP's 104. At the intersection of a CTQ 102 and KCP 104, an interaction weight 106 may be entered representing qualitatively how the KCP affects the CTQ. The interaction weights 106 can be used to derive a quantitative measure of how a KCP influences a CTQ as described below with reference to FIG. 9. The KCP's 104 are arranged in a plurality of groups 110, 112 and 114. Each group of KCP's may correspond to a respective sub-system. A second level quality matrix is formed for each of the groups of KCP's. For example, as shown in FIG. 4, the first level KCP's in group 110 are used as the CTQ's 202 in second level quality matrix 200. The second level quality matrix 200 is similar to the first level quality matrix 100 in that the CTQ's 202 are related to KCP's 204 through interaction weights 206. In addition, the second level KCP's 204 are arranged in groups 210, 212 and 214. A third level quality matrix(not shown in FIG. 4) can be formed for each group of second level KCP's 210, 212 and 214 by using the KCP's for each group 210, 212 and 214 as the CTQ's in third level quality matrices. Second level quality matrices 230 and 240 are generated for KCP groups 112 and 114 in a manner similar to quality matrix 200 for each remaining subsystem.

Figure 5:
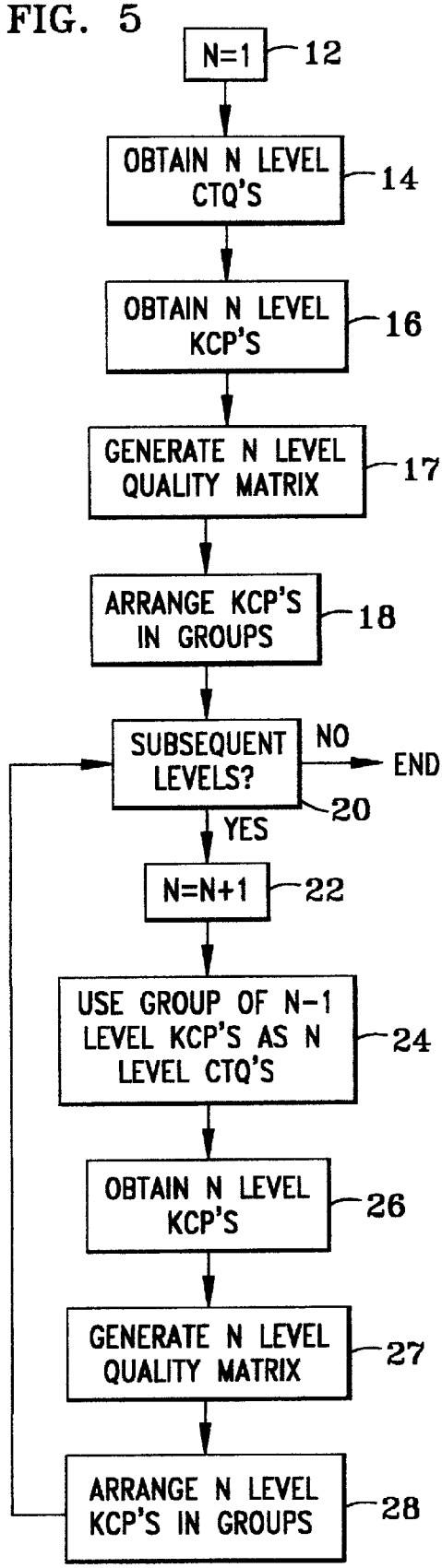
FIG. 5 is a flowchart of a process for generating quality matrices used in the quality function deployment of FIG. 4.

FIG. 5 is a flowchart of a process of generating the quality matrices in FIG. 4. The process may be implemented on a general purpose computer programmed to execute the steps shown in FIG. 5. At step 12, a variable N is set to one and is used to track the level of each quality matrix. At step 14, the CTQ's for level N are obtained. The CTQ's may be obtained from memory or through any suitable user interface, such as described below with reference to FIG. 6. At step 16, the KCP's for level N are obtained. The KCP's may be obtained from memory or through the user interface. At step 17, the N level quality matrix is formed identifying a relationship between one or more CTQ's and KCP's. At step 18, the KCP's are arranged in groups if the KCP's were not entered in groups in step 16. As described above, the groups correspond to the CTQ's of subsequent level quality matrices. At step 20, it is determined if there are subsequent levels. If not, the process ends. If so, the variable N is incremented by one at step 22 and subsequent level quality matrices are formed for each group of KCP's for the preceding level. At step 24, a group of KCP's from the N-1 level quality matrix is used as the CTQ's for the N level quality matrix. At step 26, the KCP's for the N level quality matrix are obtained, and, at step 27, the N level quality matrix is formed identifying a relationship between one or more CTQ's and KCP's. The KCP's are arranged in groups at step 28 if not previously grouped. Flow proceeds to step 20 where the process is continued until all levels have been generated.

FIG. 6 depicts an exemplary user interface that can be used to input respective CTQs of system, sub-systems, components, etc. The user interface is depicted as a table 150, such as a computer-readable table, through which the user identifies the system, sub-systems, components for each subsystem, etc. to define the levels of the system. It is understood that other user interfaces may be used and the format shown in FIG. 6 is exemplary. The CTQ's for each level of the system are also entered in table 150. For example, as shown in FIG. 6, the user has identified three subsystems (lamp, cooling system and lens) each of which has respective CTQ's. As described above, the CTQ's of a subsequent level are the KCP's of a current level so that the user only enters CTQ's. Quality matrices, such as those shown in FIG. 4, will be generated automatically. The table format of user interface 150 is an analogous representation to the tree architecture of FIG. 1 as shown in FIG. 6 but without suffering the limitations of the tree architecture of FIG. 1. This can be viewed as an enhanced lateral relation between system elements rather than the only vertical architecture shown in FIG. 1.

It will be appreciated that, in some cases, CTQ's of a subsystem will be dependent on CTQ's of other subsystems. For example, lamp subsystem CTQ's may depend on the fan CTQ's. In that case, the fan CTQ's can be reported twice; once in the lamp sub-system quality matrix and once in the cooling sub-system quality matrix. The lamp sub-system quality matrix and the cooling sub-system quality matrix share a common KCP. In this scenario, the lamp sub-system CTQ's may be considered dependent on the independent fan CTQ's. The independent CTQ's can be reported in different quality matrices as long as it is understood that they refer to the same set of CTQ's.

Figure 1:
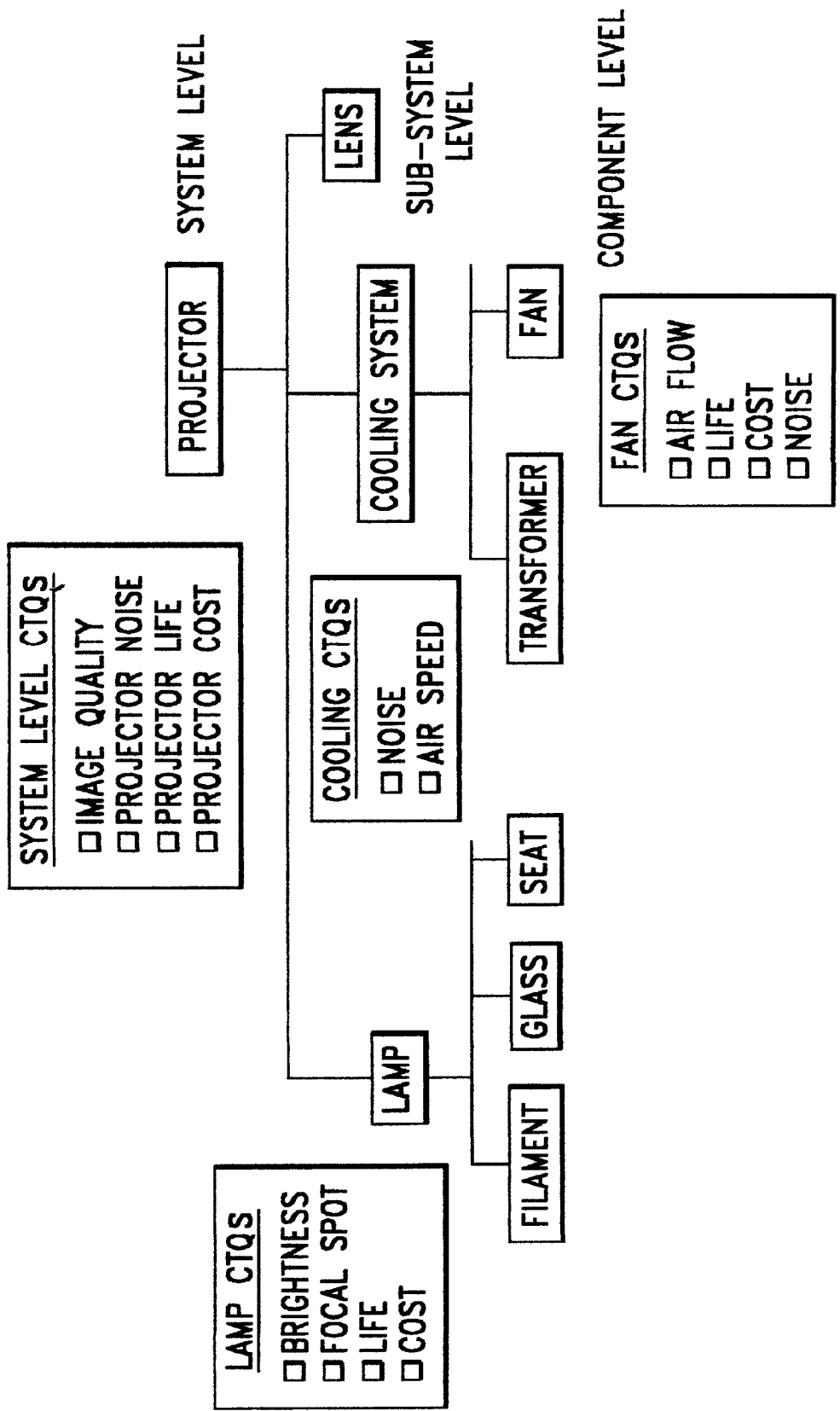
FIG. 1 is block diagram depicting a prior art tree structure of an exemplary system.
Figure 2:
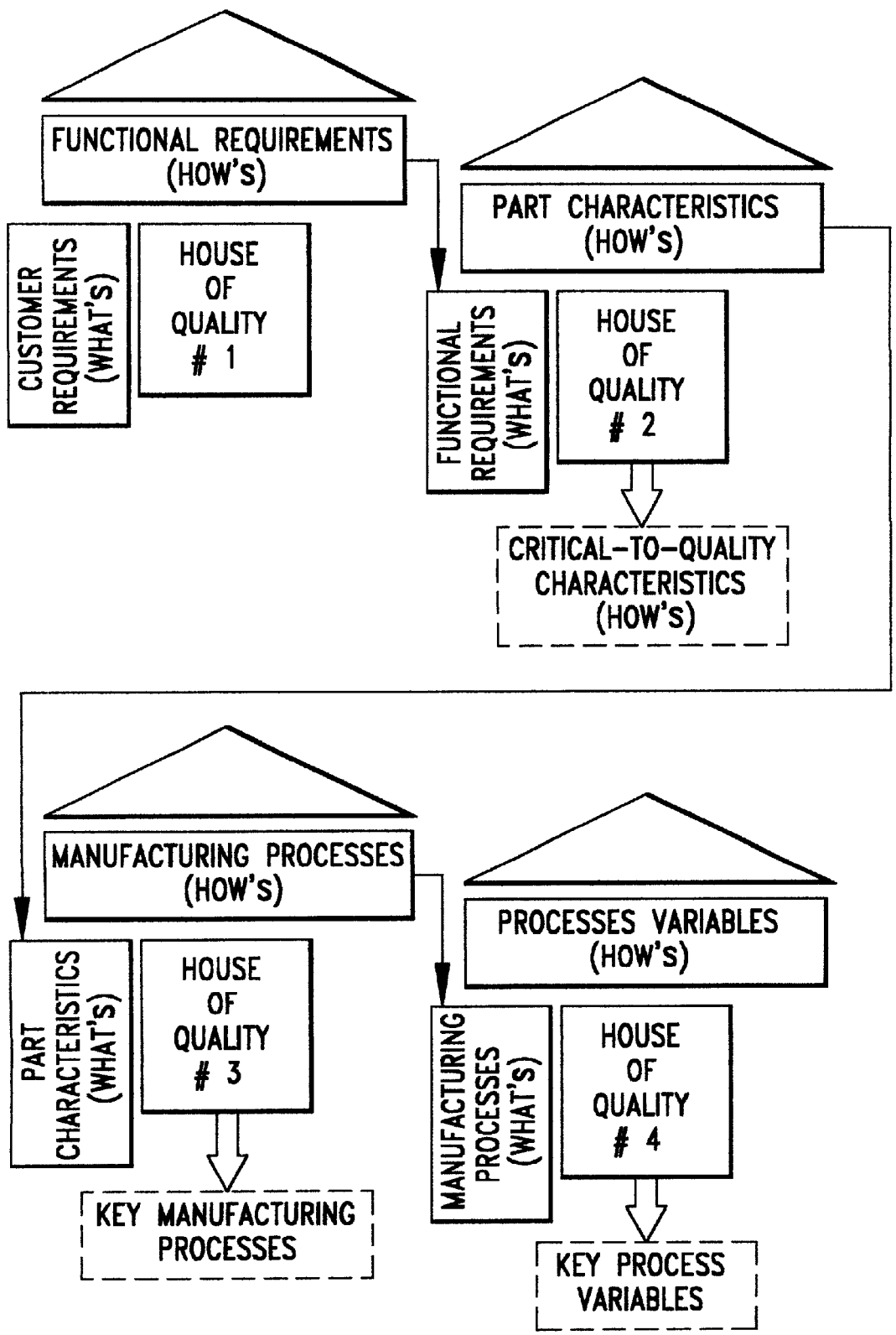
FIG. 2 is a diagrammatic representation of a prior house of quality deployment across multiple levels.
Figure 7:
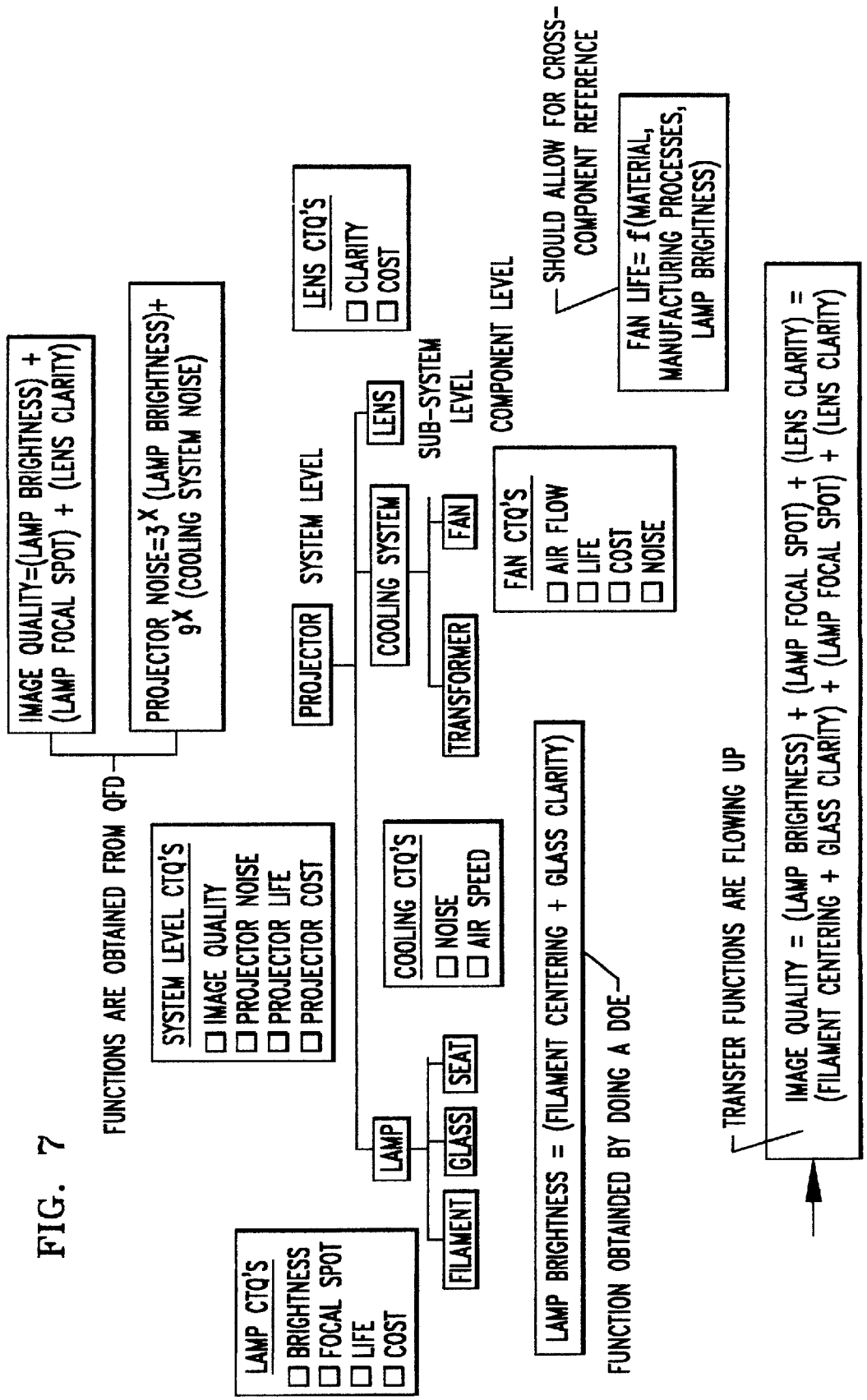
FIG. 7 depicts a system representation including transfer functions.

As suggested above, existing QFD has a drawback in that the relationships between CTQ's and KCP's are usually more complex than can be qualitatively identified by high, medium, or low. Generally, the relation between CTQ's and KCP's can be better described quantitatively through the use of respective transfer functions. FIG. 7 shows the tree structure of FIG. 1 depicting relationships between CTQ's and KCP's using various exemplary transfer functions. For example, the system level CTQ of image quality is defined as a function of lamp brightness, lamp focal spot and lens clarity. The transfer functions can be used in the framework of QFD by replacing the high, medium, and low interaction weights with a mathematical sensitivity of each dependent CTQ to each KCP. The mathematical sensitivity is a quantitative value based on the transfer function and may correspond to the partial derivative of the transfer function relating the CTQ to the KCP's.

A system level CTQ can be the function of a sub-system CTQ which in turn is a function of a third level CTQ, etc. Therefore, a first level CTQ can be a function of the lowest level KCP's through a chain of transfer functions. This type of relationship may be appreciated from FIG. 7 where image quality (a system level CTQ) is a function of lamp brightness, lamp focal spot, and lens clarity. Lamp brightness itself is a function of filament centering and glass clarity. Therefore, the image quality can be a function of filament centering, glass clarity, lamp focal spot, and lens clarity. This chain of functions may continue until the system CTQ's are expressed as lowest level KCP's. This provides a quantitative transfer function which facilitates optimizing system CTQ's by modifying lower level KCP's.

It will be understood by those skilled in the art that the transfer functions relating CTQ's to KCP's do not have to be closed form mathematical equations. The transfer functions may be represented by computer-aided processes and routines that relate CTQ's to KCP's. FIG. 8 depicts use of CAD/CAM/CAE (or any other modeling or analysis tool that provides quantifiable relationships, such as finite-element tools) to relate CTQ's to KCP's in an exemplary circuit breaker system. In addition, the transfer functions relating CTQ's to KCP's can be either probabilistic or deterministic, and computational tools (e.g., Monte-Carlo, propagation of error, fast probabilistic integration, etc.) can be utilized as part of the transfer function itself. It is believed that one condition in utilizing transfer functions is that each CTQ be defined uniquely as a function of other KCP's. Lateral relations between CTQ's are also accommodated as long as the above condition holds.

Using transfer functions to relate CTQ's to KCP's provides for quantitative QFD. In many cases, however, a transfer function cannot be established to relate certain types of CTQ's and KCP's either because of their complexity or because they do not have a physical representation. In this situation, empirically and/or experimentally derived transfer functions may be utilized. A qualitative QFD, based on low, medium and high interaction weights, can be translated into empirical and/or experimental transfer functions. This is accomplished by assigning a set of numerical weights $w_1$, $w_2$, and $w_3$ corresponding to high, medium, or low (respectively) interaction weights to define the relationship between CTQ's and KCP's. The relationship $w_1 > w_2 > w_3$ should be maintained while selecting the weights. In the example in FIG. 9, a high interaction is assigned a weight of 9, a medium interaction is assigned a weight of 3 and a low interaction is assigned a weight of 1. As shown in FIG. 9, the CTQ of projector noise is equated to the KCP's through empirical transfer function 3*(lamp brightness)+9*(cooling system noise). The projector cost CTQ is represented by lens cost+lamp cost. For the projector cost CTQ, the relevant KCP's have the same interaction weight (i.e., high) so the numerical weights are not needed in the empirical transfer function. In the example shown in FIG. 9, a linear combination of independent CTQ's was utilized for the empirical transfer function, however, other empirical equations (including nonlinear functions) can be utilized as appropriate. It is understood that interaction weights other than high, medium and low may be used. For example, if only high and low are used as interaction weights then only two numerical weights w1 and w2 are required. Alternatively, a numerically continuous range (e.g., 1–10) of numerical weights can be used.

FIG. 10 depicts an exemplary quality matrix shown generally at 300 based on customer expectations. The quality matrix may be created for one or more levels of a multi-level design process. As suggested above, it will be appreciated that the quality matrix could be adapted for tracking and assessing relationships at one or more levels of a multi-level system. The quality matrices provide for tracking and assessing the relationship between critical to quality characteristics and key control parameters within a level and between levels of the design process. Critical to quality characteristics 310 are labeled y1–y6 and are arranged in rows. Key control parameters 312 are labeled x1–x8 and are arranged in columns. In the example shown in FIG. 10, the quality matrix is based on a present snapshot of market data (alternative or additional examples of useful system data not shown in FIG. 10 include customer requirement data and technology data, for example) and the critical to quality characteristics 310 may be an original set of customer expectations. The key control parameters 312 are product requirements. It is understood that other critical to quality characteristics and key control parameters may be arranged in a matrix as described below. Each critical to quality characteristic 310 and key control parameter 312 may be associated with stored data providing information for each entry (e.g., source of the data, assumptions, ranges, exceptions, etc.). The matrix 300 may be expanded by adding critical to quality characteristics and/or key control parameters.

Each critical to quality characteristic is assigned an importance or weight as shown in column 314. The critical to quality weights range from 1 to 5 (with 5 being the highest) depending on how important each critical to quality characteristic is to customer expectation. It is understood that different weights may be used. For each critical to quality characteristic 310 and each key control parameter 312, an interaction weight 316 is assigned representing the effect that a key control parameter 312 has on a critical to quality characteristic 310. The exemplary interaction weights shown in FIG. 10 comprise the letters h, m, and l representing high, medium and low respectively. For example, at the intersection of critical to quality characteristic y1 and key control parameters x1, h indicates that key control parameters x1 has a high effect on critical to quality characteristic y1.

A total score is generated for each key control parameter as shown in row 318. Each interaction weight 316 may be assigned a numerical value. In the example shown in FIG. 10, low has a value of 1, medium has a value of 3 and high has a value of 9. To generate the total score for each key control parameter 312, the interaction weights 316 are multiplied by the critical to quality weights 314 along a column of the matrix and these products are summed. If a key control parameter is not assigned an interaction weight, its interaction weight is zero. For example, key control parameter x1 has a high interaction weight with critical to quality characteristic y1 and a low interaction weight with critical to quality characteristic y6. The total score for key control parameter x1 is (9·5)+(1·1)=46. The total score indicates the key control parameters that contribute the most to the critical to quality characteristics. A total column 320 contains a total score for each critical to quality characteristic 310 which may serve as a consistency check. Critical to quality characteristics having similar critical to quality weights 314 should have similar scores in total column 320. If critical to quality characteristics 310 having similar critical to quality weights 114 but significantly different values in total column 320, this may indicate that a critical to quality characteristic 310 should be a key control parameter 312 or that one or more key control parameters are missing.

Figure 11:
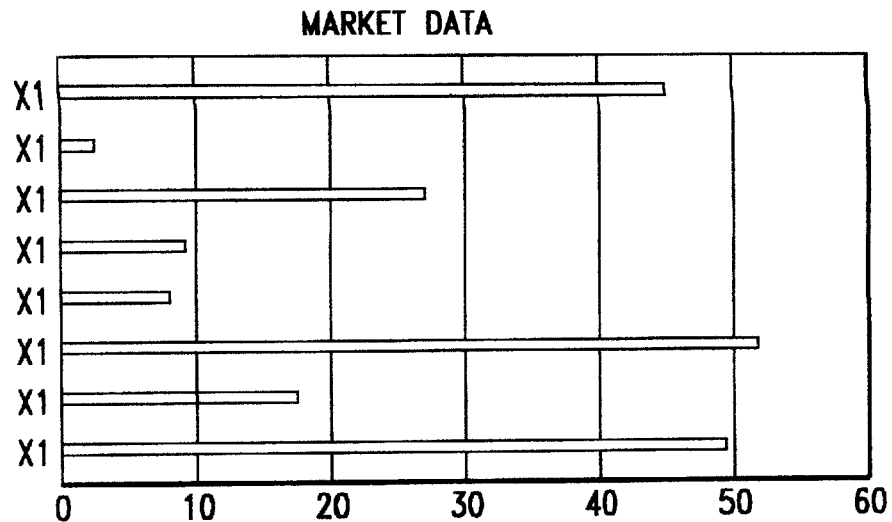
FIG. 11 is an exemplary graphical representation of scores for key control parameters.

FIG. 11 depicts an exemplary pareto graph of the total score for each key control parameter. Since the present invention may be implemented on a general purpose computer, the user may create matrix 300, enter the critical to quality weights 314 and the interaction weights 316 through a suitable user interface. The process then computes the total score row 318. FIG. 11 depicts a pareto graph of the total score values that may be presented to a user to visually facilitate identification of key control parameters having the greatest effect on critical to quality characteristics.

Figure 12:
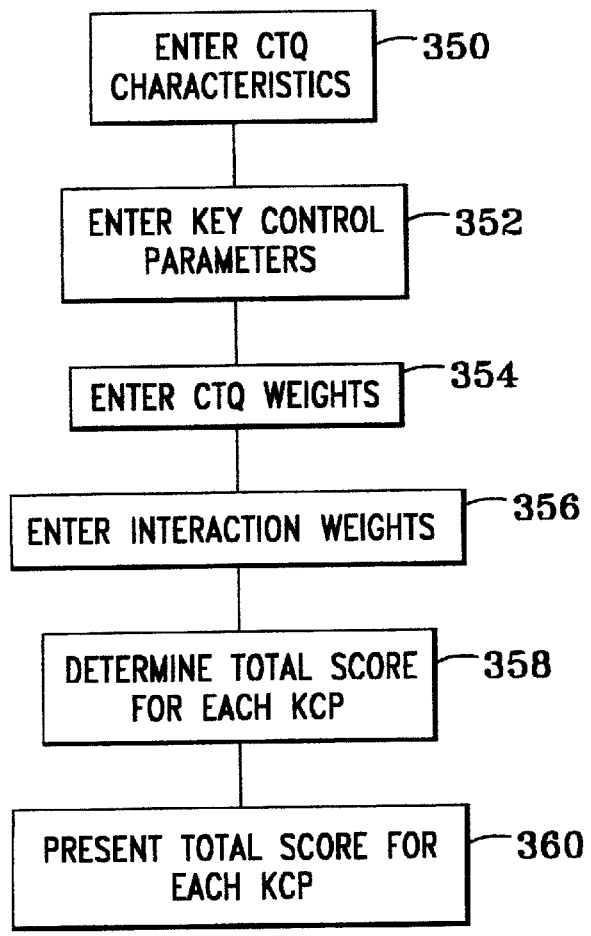
FIG. 12 is a flowchart of a process for generating the quality matrix of FIG. 10.

FIG. 12 is a flowchart depicting exemplary steps for creating the quality matrix shown in FIG. 10. The process begins at step 350 where the user enters the critical to quality characteristics y1–yn. Flow proceeds to step 352 where the user enters the key control parameters x1–xn. At step 354, the critical to quality weights 314 are entered, and, at step 356, the interaction weights 316 are entered for each combination of critical to quality characteristics and key control parameters. At step 358, the total score 318 for each key control parameter is determined as described above. At step 360, each respective total score for each key control parameter is presented to the user either numerically as shown in FIG. 10, graphically as shown in FIG. 12, or both.

The process of creating a quality matrix may be performed for multiple levels of the design process. FIG. 13 depicts a plurality of quality matrices each corresponding to one level of a hierarchical design process. Matrix 300, as discussed in the context of FIG. 10, may be based on market data, for example. Matrix 400 uses the key control parameters 312 from matrix 300 as the critical to quality characteristics 410. Matrix 400 is directed to product design and associates the product requirements represented by critical to quality characteristics 410 with deign features represented by key control parameters 412. Matrix 400 includes critical to quality weights 414 and interaction weights 416 similar to those described above with reference to FIG. 10. A total score 418 is determined for each key control parameter 412 as described above.

When there exists a higher level matrix, entering step 354 (FIG. 12) for entering the critical to quality weights 416 may be performed automatically by the system based on the total scores 318 from prior matrix 300. The total score 318 from matrix 300 may indicate the importance of the critical to quality characteristics 410. To determine critical to quality weights 414, the total score 318 for each critical to quality characteristic 410 may be compared to a first threshold and a second threshold. By way of example, scores equal to or exceeding the second threshold are assigned an importance of 5. Scores equal to or below the first threshold are assigned an importance of 1. Scores between the first and second threshold are assigned an importance of 3. In addition, the scores 318 may be normalized by dividing each score by the maximum score.

Quality matrix 500 is directed to product manufacturing and associates the design features represented by critical to quality characteristics 510 with manufacturing processes represented by key control parameters 512. Matrix 500 uses the key control parameters 412 from matrix 400 as the critical to quality characteristics 510. Matrix 500 includes critical to quality characteristic weights 514 and interaction weights 516 similar to those described above with reference to FIG. 10. A total score 518 is determined for each key control parameter as described above. The critical to quality characteristic weights 516 may be automatically determined based on the total scores 418 as described above with reference to matrix 400.

Figure 14:
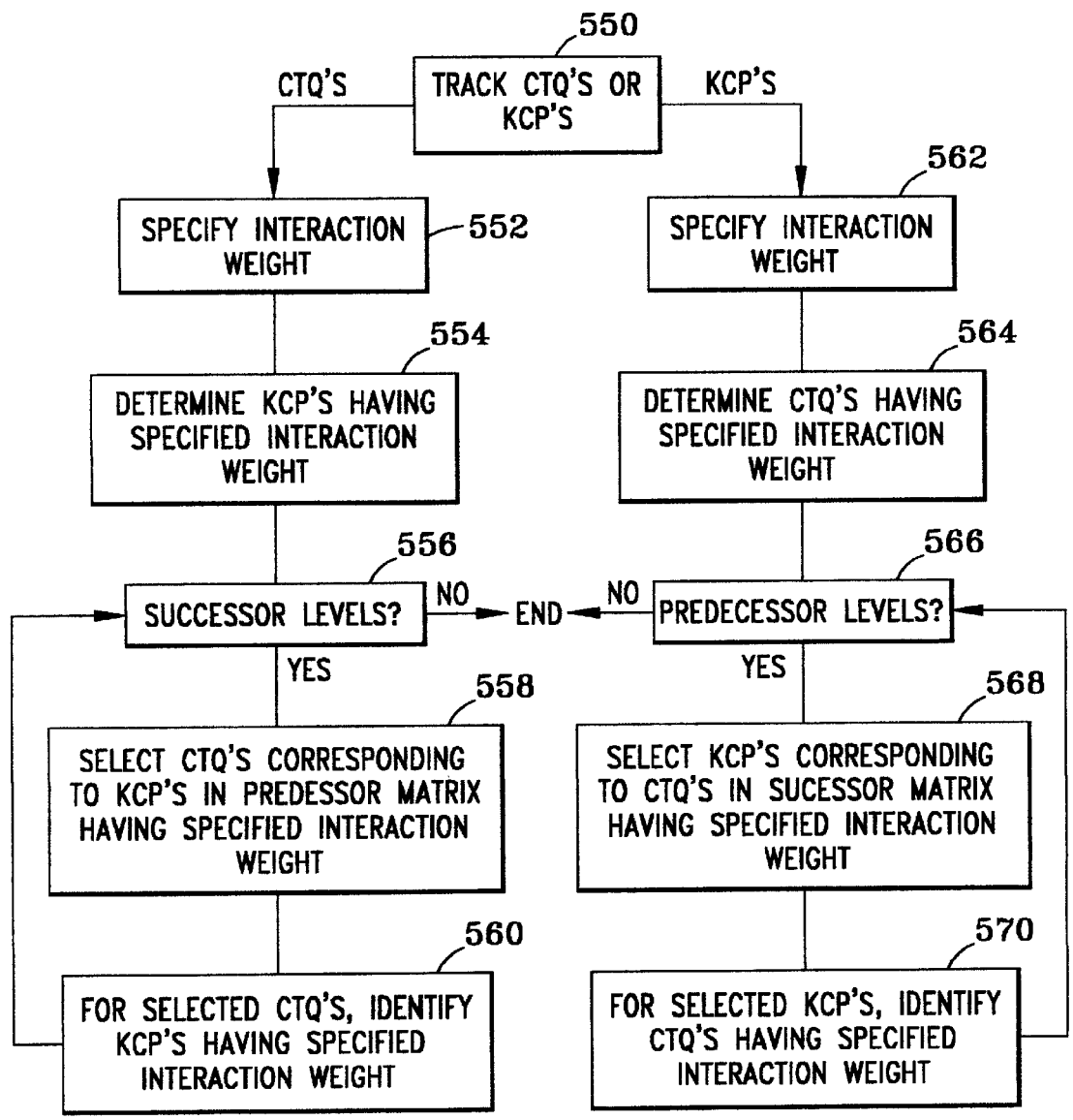
FIG. 14 is a flowchart of the process of tracking critical to quality characteristics or key control parameters in another aspect of the present invention.

The hierarchical relationship between the quality matrices and the use of key control parameters from a prior matrix as the critical to quality characteristics in a subsequent matrix allows for tracking of critical to quality characteristics or key control parameters having a specified level of interaction. FIG. 14 is a flow chart of an exemplary process for tracking critical to quality characteristics or key control parameters having a specified level of interaction. At step 550, the user can select between tracking critical to quality characteristics (CTQ's) or key control parameters (KCP's). If the user selects critical to quality characteristics, flow proceeds to step 552 where the user defines the level of interaction weight to be tracked. For example, the user may desire to locate all critical to quality characteristics having high interaction weights with key control parameters. The user may also designate a single critical to quality characteristic (e.g., y1) and track key control parameters having the desired interaction weight. At step 554, the key control parameters having the desired interaction weight (e.g., high) are detected and displayed to the user as described herein. At step 556, the process determines if there exists any successor levels. If not, the process ends. If so, at step 558 the process examines the successor matrix and selects critical to quality characteristics corresponding to the key control parameters having the specified level of interaction in the previous matrix. As described above, the key control parameters from a predecessor level are used as the critical to quality characteristics in a successor level. At step 560, the critical to quality characteristics selected at step 558 are examined for key control parameters having the desired interaction weight. Flow proceeds to step 556 and the process continues until all the levels of matrices have been processed.

If at step 550, the user selects to track key control parameters, flow proceeds to step 562. The process for tracking key control parameters is similar to that of tracking critical to quality characteristics but it is performed from low levels to high levels. At step 562, the user defines the level of interaction weight to be tracked. For example, the user may desire locating all key control parameters having high interaction weights with critical to quality characteristics. At step 564, the critical to quality characteristics having the desired interaction weight (e.g., high) are detected and displayed to the user as described herein. At step 566, the process determines if there exists any predecessor levels. If not, the process ends. If so, at step 568 the process examines the predecessor matrix and selects key control parameters corresponding to the critical to quality characteristics having the specified level of interaction in the previous matrix. As described above, the critical to quality characteristics from a successor level are the key control parameters in a predecessor level. At step 570, the key control parameters selected at step 568 are examined for critical to quality characteristics having the desired interaction weight. Flow proceeds to step 566 and the process continues until all the levels of matrices have been processed.

FIG. 13 illustrates the process of tracking critical to quality characteristics having a high interaction weight with key control parameter y2. As shown in the market data matrix, critical to quality characteristic y2 has a high interaction weight with key control parameter x8. Both row y2 and column x8 may be highlighted in color, as represented by the cross-hatching in FIG. 13. Moving to the successor design matrix, critical to quality characteristic x8 is examined and key control parameters df4, df5, and df6 are found to have a high interaction weight with critical to quality characteristic x8. Row x8 and columns df4, df5, and df6 are highlighted in color as shown by the cross-hatching. Moving to the design matrix, critical to quality characteristics df4, df5 and df6 are examined and key control parameters mp1 and mp3 are found to have a high interaction weight with critical to quality characteristics df4, df5, and df6. Rows df4, df5 and df6 and columns mp1 and mp3 are highlighted in color as shown by cross-hatching. By highlighting rows and columns where the desired interaction weight is found, the user is presented with an easily readable format for determining the relationship between critical to quality characteristics and key control parameters across multiple levels. The information from the highlighted rows and columns may then be extracted to a partitioned QFD to highlight the significant aspects of the QFD. The relative scores may change in performing the extraction because some interactions will be omitted.

Figure 15:
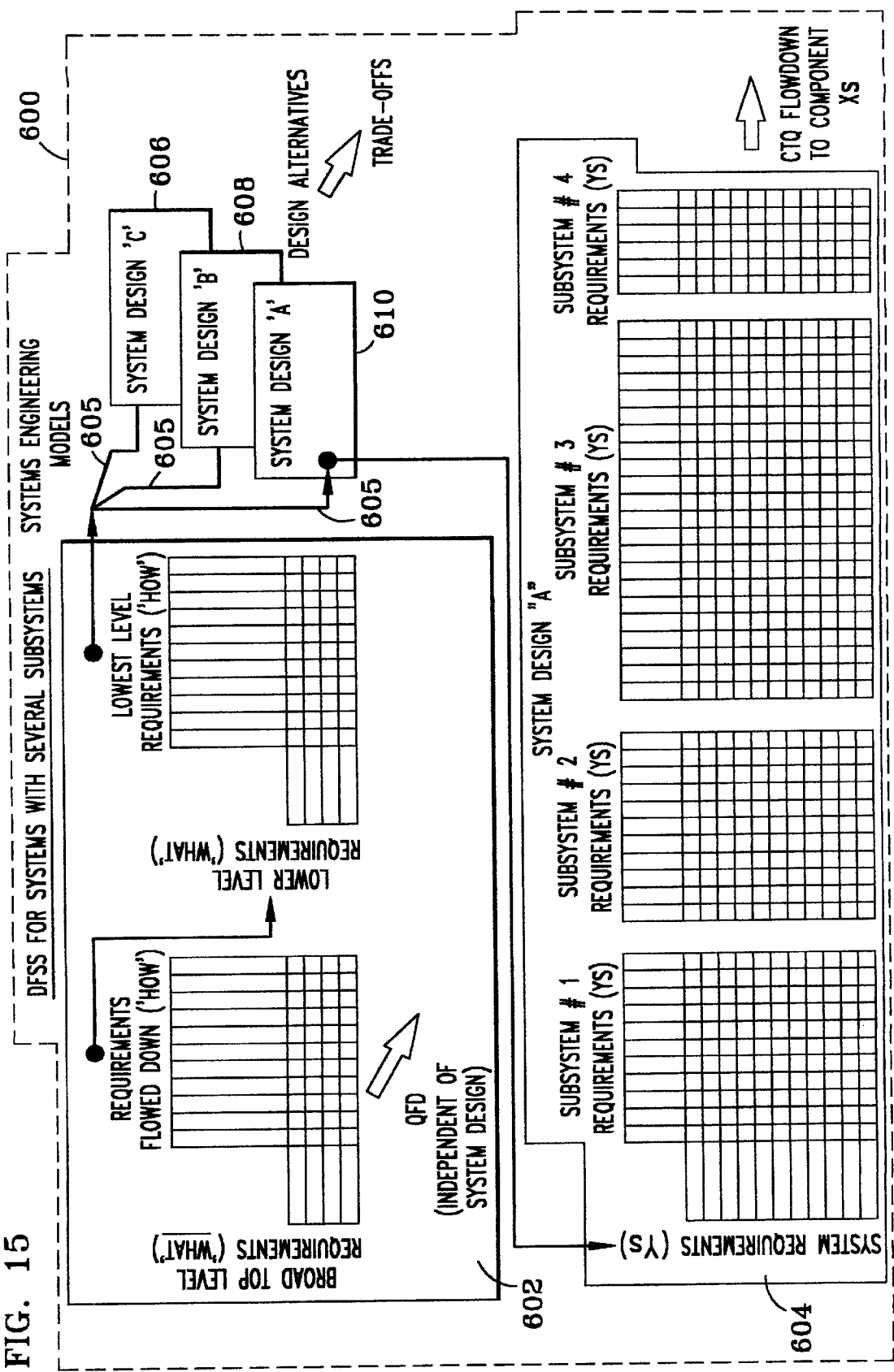
FIG. 15 is block diagram of a quality design processing tool that integrates the quality deployment tool with the critical to quality tool through respective models of a respective family of subsystem alternatives relative to an original set of critical to quality parameters.

As shown in FIG. 15, an automated quality design processing tool 600 embodying another aspect of the present invention allows for integrating the QFD tool 602, as described in the context of FIGS. 4–9 with the CTQ tool 604, as described in the context of FIGS. 10–14 via one or more respective links 605, such as systems engineering and requirements-management links, that may beselectively coupled to respective modules representative of respective-members of families of subsystem design alternatives, such as alternative system designs 606, 608 and 610. Examples of commercially available tools including links for enabling such integration include but are not limited to system design tools, such as DOORS and CORE tools. As will be readily understood by those of ordinary skill in the art, the DOORS tool, available from Quality Systems & Software (QSS), comprises a requirements management tool that enables users, such as managers, developers, end users, etc., to manage and trace system requirements throughout the life of a given project. The CORE tool, available from Vitech, comprises a systems engineering tool that allows for providing a computer-readable architectural representation of a given system and its components.

It will be now appreciated by those skilled in the-art that such integrated tool provides substantially enhanced capabilities. As suggested above, the QFD tool enables the tracking down of top-level customer needs to measurable system/product requirements (MSR). These requirements are generally independent of the system/product being designed. Typically, several system design alternatives are considered, and trade-off analysis performed before settling on a particular system design. The CTQ tool enables the tracking of the MSR down into the subsystems of the specific design being addressed. With direct links between the QFD tool and the CTQ tool, such as may be provided via systems engineering tools, the extent to which the top customer needs are met may now be directly tracked down to the subsystem level. The automated requirements' management tracking, and module for analyzing alternative system/subsystems design trade-off would permit continuous evaluation of several design alternatives. For example one could evaluate the advantages and disadvantages of a double-contact circuit breaker versus a single-contact breaker, each alternative design meeting the same top level customer needs.

Figure 16:
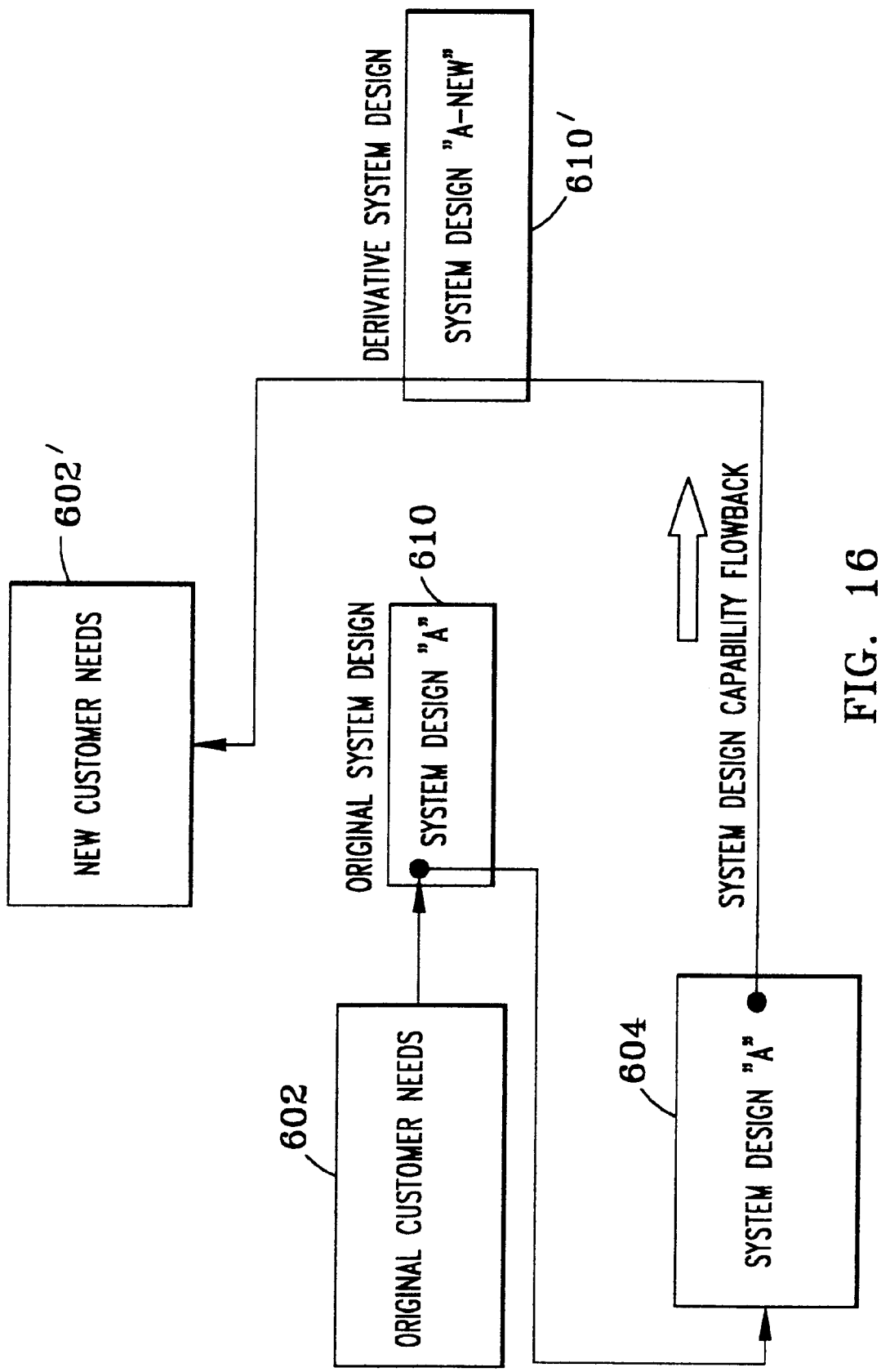
FIG. 16 is a block diagram of the quality design tool of FIG. 15 that enables evaluating a derivative system design in view of a new set of critical to quality parameters.

As shown in FIG. 16, integrated quality design tool 600 allows the evaluation of system and subsystem design capability by flowing-back from the lowest level, all the way up to the top level, to help identify potential new customers/markets that may be already met by original system design 610, or could be met by making relatively minor changes to the original system design. This follows since systems designed to meet specific top customer needs may often satisfy a subset of requirements for a different application/customer. Further, respective systems (and corresponding families of subsystem alternatives) meeting customer needs for a particular application often satisfy additional requirements of different systems beyond those required by the particular application. Thus, using tool 600 for determining such bonus capability would allow for satisfying additional needs unrelated to the original CTQs, after making relatively minor modifications/additions to the original design (and corresponding modifications to the original set of critical to quality parameters). For example, an aircraft engine, with minor design modifications, could meet marine and industrial requirements. In operation, tool 600 is believed to be able to avoid lengthy years of development time as derivative systems are designed from the original system to serve new markets, new applications, while adapting to new technological and competitive developments, or new trends in the market place, etc. It will be recognized that a natural extension of tool 600 is to be able to flow-back a design of other business enterprises to evaluate potential new markets/applications that such enterprises may be considering. In one exemplary embodiment, tool 600 may be deployed via the Internet or an intranet communications network using web-enabled tools well-understood by those skilled in the art, such as a respective server, browser, etc. In such exemplary embodiment, tool 600 may include a web-based search engine which will allow multiple users at remote locations for executing trade-off analysis of various subsystems and components to satisfy required performance, reliability, manufacturing, cost requirements, etc.

In another aspect of the integrated tool of the present invention, it is believed that such tool would allow for evaluating new technologies that can be embedded in new or mature systems. This would serve as a vehicle to perform trade-off studies on potential new technologies, and additionally, would allow for identifying new areas for appropriate allocation of resources, such as research, development and technology thrust. For example, as shown in FIG. 17, an integrated model 650 of the various subsystems of a circuit breaker 652 and a suitable tool 653 for modeling characteristics of the circuit breaker could be selectively coupled to integrated quality design tool 600 to identify new technology thrusts and research opportunities in various technologies that could affect the performance of the circuit breaker system, such as interrupter technology, arc physics technology, etc. When a new technology is about to be developed, or exists in other applications, modules representative of such new technology, e.g., modules 654 through 657, can be selectively coupled or plugged into the integrated tool of the present invention and, as a result, any benefits or detriments will appear on the top level CTQs. This type of information, in many cases, is needed by business people to justify committing resources to a new technology, either by developing it, or by acquiring it. Thus, in operation tool 600 allows for selectably plugging-in and plugging-out respective subsystem and system modules representative of new and existing technologies (and of corresponding members of families of subsystem alternatives), so as to be able to flow up to the customer needs level in a seamless manner. As shown in FIG. 16, the flow back action allows for analyzing data, such as new customers needs 602' so as to be able to modify the original system design 610 to create a derivative system design 610' (including one or more derivatives of the systemdesign's subsystem designs) without having to incur all the developmental costs that would otherwise be incurred if one were to start a brand new design to meet the new customer needs.

The present invention can be embodied in the form of computer-implemented processes and apparatus for practicing those processes. The present invention can also be embodied in the form of computer program code containing computer-readable instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as an exemplary mode contemplated for carrying out this invention, but that the invention will include all embodiments falling within the scope of the appended claims.

What is claimed is:

1. A method for integrating a quality function deployment tool with a critical to quality tool, each of said tools comprising computer-enabled tools, the method comprising;
   executing quality function deployment at each of a plurality of levels with the quality function deployment tool for a system designable from a respective family of subsystem alternatives;
   generating quality matrices indicating a relationship between an original set of critical to quality characteristics and key control parameters with the critical to quality tool for the respective family of subsystem alternatives; and
   linking the quality function deployment tool to the critical to quality tool for tracking at each level the extent to which the original set of critical to quality characteristics is met by each respective family of subsystem alternatives.

2. The method of claim 1 wherein each family of subsystem alternatives comprises an original system design.

3. The method of claim 2 wherein the original set of critical to quality parameters is based on predefined data for the original system design.

4. The method of claim 3 wherein the predefined data for the original system design is selected from the group consisting of presently available customer requirement data, market data, and technology data.

5. The method of claim 1 further comprising tracking at each level the extent to which each respective family of subsystem alternatives meets a modified set of critical to quality parameters.

6. The method of claim 5 wherein the modified set of critical to quality parameters is based on new data for the original system design.

7. The method of claim 5 further comprising determining for each family of subsystem alternatives a derivative of one or more subsystem alternatives that meets the modified set of critical to quality parameters.

8. The method of claim 1 further comprising determining the extent to which each respective family of subsystem alternatives meets a set of critical quality parameters for a different system.

9. The method of claim 8 further comprising determining from each family of subsystem alternatives a derivative of one or more subsystem alternatives that meets the set of critical quality parameters for the different system.

10. The method of claim 1 further comprising selectably coupling respective modules representative of respective members of each family of subsystem alternatives to determine effects to the set of critical to quality parameters caused by the selectably coupled modules.

11. The method of claim 10 wherein the respective modules are based on new technological developments for a given member of each family of subsystem alternatives.

12. The method of claim 10 wherein the respective modules are based on new applications of established technologies for a given member of each family of subsystem alternatives.

13. The method of claim 10 wherein the respective modules are based on competitive developments for a given member of each family of subsystem alternatives.

14. A computer-readable medium encoded with computer program code for integrating a quality function deployment tool with a critical to quality tool, each of said tools comprising computer-enabled tools, the program code causing a computer to execute a method comprising:

执行 quality function deployment at each of a plurality of levels with the quality function deployment tool for a system designable from a respective family of subsystem alternatives for an original system design;

generating quality matrices indicating a relationship between an original set of critical to quality characteristics and key control parameters with the critical to quality tool for the respective family of subsystem alternatives, the original set of critical to quality parameters based on predefined data for the original system design;

linking the quality function deployment tool to the critical to quality tool for tracking at each level the extent to which the original set of critical to quality characteristics is met by each respective family of subsystem alternatives;

tracking at each level the extent to which each respective family of subsystem alternatives meets a modified set of critical to quality parameters based on new data for the original system design; and determining for each family of subsystem alternatives a derivative of one or more subsystem alternatives that meets the modified set of critical to quality parameters.

15. The computer-readable medium of claim 14 wherein the predefined data for the original system design is selected from the group consisting of presently available customer requirement data, market data, and technology data.

16. The computer-readable medium of claim 15 further comprising determining the extent to which each respective family of subsystem alternatives meets a set of critical quality parameters for a different system.

17. The computer-readable medium of claim 16 further comprising determining from each family of subsystem alternatives a derivative of one or more subsystem alternatives that meets the set of critical quality parameters for the different system.

18. The computer-readable medium of claim 14 further comprising selectably coupling respective modules representative of respective members of each family of subsystem alternatives to determine effects to the set of critical to quality parameters caused by the selectably coupled modules.

19. The computer-readable medium of claim 18 wherein the respective modules are based on new technological developments for a given member of each family of subsystem alternatives.

20. The computer-readable medium of claim 18 wherein the respective modules are based on new applications of established technologies for a given member of each family of subsystem alternatives.

21. The computer-readable medium of claim 18 wherein the respective modules are based on competitive developments for a given member of each family of subsystem alternatives.

22. A processor configured to integrate a quality function deployment tool with a critical to quality tool, each of said tools comprising computer-enabled tools, the processor comprising:

a processor module configured to execute quality function deployment at each of a plurality of levels for a system designable from a respective family of subsystem alternatives for an original system design;

a generator module configured to generate quality matrices indicating a relationship between an original set of critical to quality characteristics and key control parameters for the respective family of subsystem alternatives, the original set of critical to quality parameters based on predefined data for the original system design;

a linking module configured to link the quality function deployment tool to the critical to quality tool to track at each level the extent to which the original set of critical to quality characteristics is met by each respective family of subsystem alternatives;

a tracking module configured to track at each level the extent to which each respective family of subsystem alternatives meets a modified set of critical to quality parameters based on new data for the original system design;

a processing module configured to determine for each family of subsystem alternatives a derivative of one or more subsystem alternatives that meets the modified set of critical to quality parameters; and a coupling module configured to selectably couple respective modules representative of respective members of each family of subsystem alternatives to determine effects to the set of critical to quality parameters caused by the selectably coupled modules.

23. The processor of claim 22 wherein the respective selectably coupled modules are based on new technological developments for a given member of each family of subsystem alternatives.

24. The processor of claim 22 wherein the respective selectably coupled modules are based on new applications of established technologies for a given member of each family of subsystem alternatives.

25. The processor of claim 22 wherein the respective selectably coupled modules are based on competitive developments for a given member of each family of subsystem alternatives.

* * * * *